(12) United States Patent
Qin et al.

(10) Patent No.: US 9,019,462 B2
(45) Date of Patent: Apr. 28, 2015

(54) ARRAY SUBSTRATE AND METHOD FOR MANUFACTURING THE SAME, AND DISPLAY DEVICE

(75) Inventors: Wei Qin, Beijing (CN); Yun Dong, Beijing (CN)

(73) Assignee: Beijing BOE Optoelectronics Technology Co., Ltd., Beijing (CN)

( * ) Notice: Subject to any disclaimer, the term of this patent is extended or adjusted under 35 U.S.C. 154(b) by 239 days.

(21) Appl. No.: 13/699,659

(22) PCT Filed: Aug. 13, 2012

(86) PCT No.: PCT/CN2012/080020
§ 371 (c)(1),
(2), (4) Date: Nov. 23, 2012

(87) PCT Pub. No.: WO2013/023561
PCT Pub. Date: Feb. 21, 2013

(65) Prior Publication Data
US 2013/0114017 A1    May 9, 2013

(30) Foreign Application Priority Data
Aug. 12, 2011    (CN) .......................... 2011 1 0231958

(51) Int. Cl.
*G02F 1/13*    (2006.01)
*G02F 1/1343*    (2006.01)
(Continued)

(52) U.S. Cl.
CPC ............ *H01L 21/283* (2013.01); *G02F 1/1368* (2013.01); *H01L 27/1214* (2013.01);
(Continued)

(58) Field of Classification Search
CPC .................... G02F 1/134363; H01L 21/0272; H01L 21/0331; H01L 21/76877; H01L 21/7688

USPC ................................................... 349/141, 187
See application file for complete search history.

(56) References Cited

U.S. PATENT DOCUMENTS 7,348,198 B2 * 3/2008 Ahn .............................. 438/30
7,349,036 B2 * 3/2008 Hong ............................. 349/39
(Continued)

FOREIGN PATENT DOCUMENTS

CN    1655308 A    8/2005
CN    1794078 A    6/2006
(Continued)

OTHER PUBLICATIONS

International Search Report; dated Aug. 12, 2011; PCT/CN2012/080020.
(Continued)

*Primary Examiner* — Paisley L Arendt
(74) *Attorney, Agent, or Firm* — Ladas & Parry LLP

(57) ABSTRACT

Embodiments of the present invention provide an array substrate and a method for manufacturing the same, and a display device. The method comprises: depositing a first transparent electrode layer on a base substrate, coating first photoresist on the transparent electrode layer, and performing exposure and development on the first photoresist to retain the first photoresist at a location where a first transparent electrode is to be formed, so that a first photoresist pattern is formed; etching the first transparent electrode layer with the first photoresist pattern, so as to form the first transparent electrode; and depositing a second transparent electrode layer on the base substrate after the etching, and then performing a photoresist lifting-off process on the first photoresist pattern to remove a part of the second transparent electrode layer on the first photoresist pattern so that a second transparent electrode is formed.

16 Claims, 9 Drawing Sheets

(51) Int. Cl.
   *H01L 21/283* (2006.01)
   *G02F 1/1368* (2006.01)
   *H01L 27/12* (2006.01)
   *H01L 27/15* (2006.01)
   *G02F 1/1333* (2006.01)

(52) U.S. Cl.
   CPC .......... *H01L27/156* (2013.01); *H01L 27/1288* (2013.01); *G02F 1/1333* (2013.01); *G02F 1/134363* (2013.01)

(56) References Cited

U.S. PATENT DOCUMENTS

| | | | |
|---|---|---|---|
| 7,576,822 B2* | 8/2009 | Yoo et al. | 349/141 |
| 7,593,084 B2* | 9/2009 | Nam et al. | 349/141 |
| 2008/0042133 A1 | 2/2008 | Chin et al. | |
| 2010/0032672 A1 | 2/2010 | Lo | |
| 2010/0231820 A1 | 9/2010 | Ahn et al. | |

FOREIGN PATENT DOCUMENTS

| | | |
|---|---|---|
| CN | 101013240 A | 8/2007 |
| CN | 101097928 A | 1/2008 |
| CN | 101191967 A | 6/2008 |
| CN | 101226316 A | 7/2008 |
| JP | 2004-157323 A | 6/2004 |

OTHER PUBLICATIONS

International Preliminary Report on Patentability dated Feb. 18, 2014; PCT/CN2012/080020.

Chinese First Office Action dated Jul. 26, 2013; Appln. No. 201110231958.8

* cited by examiner

ARRAY SUBSTRATE AND METHOD FOR MANUFACTURING THE SAME, AND DISPLAY DEVICE

TECHNICAL FIELD

Embodiments of the present invention relate to an array substrate and a method for manufacturing the same, and a display device.

BACKGROUND

Thin film transistor-liquid crystal display (TFT-LCD) technology is mainly classified into a Twisted Nematic (TN) mode and a wide viewing angle mode. In a TN mode TFT-LCD, electrodes on two sides of a liquid crystal layer are located on a color filter substrate and an array substrate, respectively, and are in a plane, respectively; the structures of the color filter substrate and the array substrate in the TN mode are also relatively simple. The wide viewing angle mode includes a transverse electric field display technology, such as an In-panel Switching (IPS) mode, in which a more reasonable plane electric field can be fowled through combination of transparent finger-like electrodes, and the arrangement of liquid crystal molecules is optimized; and moreover, because the transparent electrodes are used in place of opaque metal electrodes, transmissivity are remarkably increased.

The structure of a conventional array substrate in the IPS wide viewing angle mode is shown in FIG. 1. The array substrate comprises: a plurality of gate lines 1, a plurality of data lines 2 and at least one common electrode line 15. The common electrode line 15 is parallel to the data lines 2. The plurality of gate lines 1 and the plurality of data lines 2 intersect each other to define a plurality of pixel units, each of which comprises a thin film transistor as a switching element, a pixel electrode 3 and a common electrode 6, and the thin film transistor is connected to the pixel electrode 5. The thin film transistor comprises a gate electrode 11, a source electrode 12, a drain electrode 13 and a semiconductor channel 3. A terminal of the common electrode 6 for pixel units in a row is electrically connected to the common electrode line 15 via a via hole 41 over the common electrode 15. A via hole 4 for electric connection to a driving circuit and so on is formed in an insulating layer over a terminal of a gate line 1. Within each of the pixel units, the pixel electrode 5 and the common electrode 6 both are comb-like electrodes, their finger parts are interdigitated, and an electric field for driving liquid crystals is formed when electricity is applied across the electrodes.

For the array substrate in the wide viewing angle mode, because the interval between the pixel electrode and the common electrode is too small, a tiny offset between two layers of electrode may cause difference in capacitance between the pixel electrode and the common electrode, thereby giving rise to a problem that the display picture is non-uniform (Mura).

FIG. 2 is a structurally schematic view showing a conventional array substrate in the IPS wide viewing angle mode when a pixel electrode 5 and a common electrode 6 are dislocated. As shown in FIG. 2, within one pixel unit, a finger part of the common electrode 6 is shifted to the right with respect to a finger part of the pixel electrode 5.

SUMMARY

Embodiments of the present invention are directed to provide an array substrate and a method for manufacturing the same, and a display device, so as to overcome the Mura problem caused by dislocation of a pixel electrode and a common electrode.

An embodiment of the present invention provides a method for manufacturing an array substrate, comprising: depositing a first transparent electrode layer on a base substrate, coating first photoresist on the transparent electrode layer, and performing exposure and development on the first photoresist to retain the first photoresist at a location where a first transparent electrode is to be formed, so that a first photoresist pattern is formed; etching the first transparent electrode layer with the first photoresist pattern so as to form the first transparent electrode; and depositing a second transparent electrode layer on the base substrate after the etching, and then performing a photoresist lifting-off process on the first photoresist pattern to remove a part of the second transparent electrode layer on the first photoresist pattern so that a second transparent electrode is formed.

Another embodiment of the present invention provides an array substrate, which is the array substrate manufactured by the above method.

Further another embodiment of the present invention provides a display device, which comprises the array substrate mentioned as above.

BRIEF DESCRIPTION OF THE DRAWINGS

In order to clearly illustrate the technical solution of the embodiments of the invention, the drawings of the embodiments will be briefly described in the following; it is obvious that the described drawings below are only related to some embodiments of the invention and thus are not limitative of the invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

An array substrate according to an embodiment of the invention comprises a plurality of gate lines and a plurality of data lines, which intersect each other to thereby define pixel units arranged in a matrix, and each of the pixel units comprises a thin film transistor as a switching element and a pixel electrode and a common electrode for controlling the orientation of liquid crystals. For each pixel, a gate electrode of the thin film transistor is electrically connected to or integrally formed with a corresponding gate line, a source electrode thereof is electrically connected to or integrally formed with a corresponding data line, and a drain electrode thereof is electrically connected to or integrally formed with a corresponding pixel electrode. In the following, descriptions are made mainly with reference to a single or a plurality of pixel units, but other pixel units can be formed in the same way.

First Embodiment

A method for manufacturing an array substrate according to a first embodiment of the invention comprises the following steps.

Step 301, sequentially performing photolithography processes to form a gate pattern, a semiconductor channel and a source-drain pattern on a base substrate, and then depositing a first transparent electrode layer.

In this step, the procedure of forming the gate pattern on the base substrate is as follows, for example.

At first, by sputtering or heat evaporation, a gate metal thin film (not shown) with a thickness of, for example, 500 Å~4000 Å, is deposited on a base substrate 10. A gate metal layer of a metal selected from Cr, W, Ti, Ta, Mo, Al, Cu, and the like, alloy thereof or multiple layers of metal can be used for the material of the gate metal thin film, and a glass or plastic substrate can be used for the base substrate 10.

Figure 1:
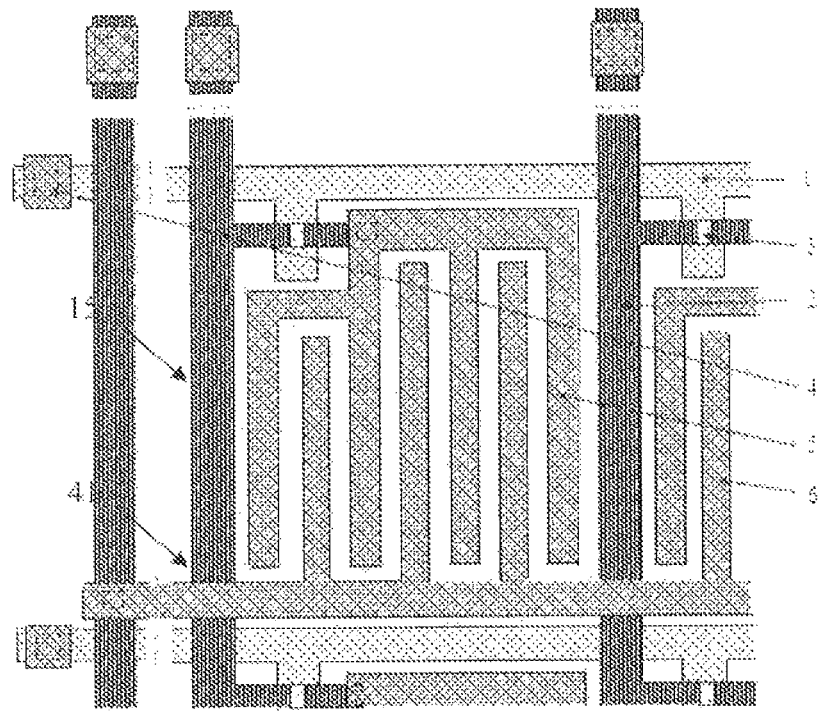
FIG. 1 is a structurally schematic view showing a conventional array substrate in an IPS wide viewing angle mode.
Figure 2:
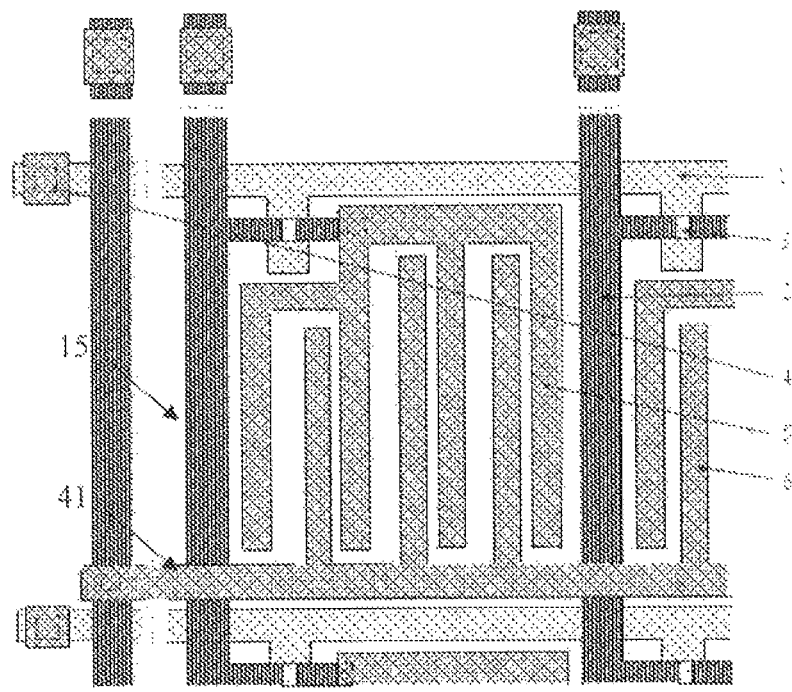
FIG. 2 is a structurally schematic view showing a conventional array substrate in the IPS wide viewing angle mode when a pixel electrode and a common electrode are dislocated.
Figure 3:
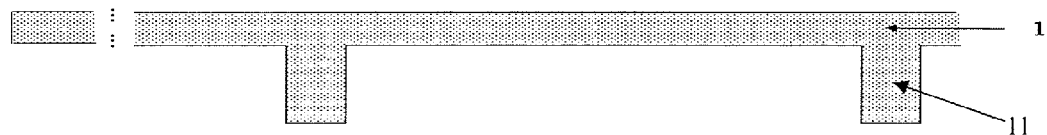
FIG. 3 is a schematic view after a gate pattern is formed in the course of manufacturing an array substrate according to a first embodiment.
Figure 3:
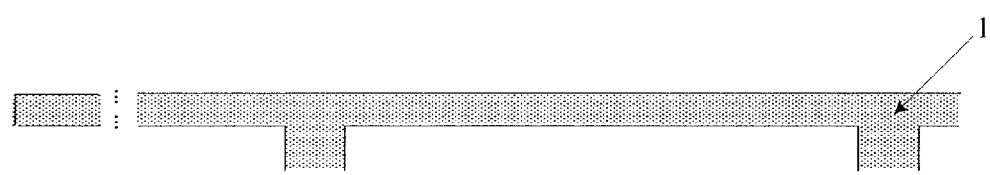

Then, photoresist (not shown) is coated on the gate metal thin film, and is exposed and developed with a mask to obtain a photoresist pattern. Subsequently, the gate metal thin film is etched by using the resultant photoresist pattern as an etching mask. After the gate metal thin film in an area without photoresist is etched, the photoresist is removed, so as to obtain a gate pattern as shown in FIG. 3. FIG. 3 illustrates upper and lower (two rows) gate lines 1 formed on the base substrate with gate electrodes 11 formed on each of the gate lines 1; here, the gate electrodes 11 are integrally formed with a corresponding gate line 11.

After the gate pattern is formed, the manufacture of the semiconductor channel and the source-drain pattern comprises, for example, the following steps. In the embodiment, the source-drain pattern comprises patterns for a data line and source and drain electrodes of a thin film transistor.

A gate insulating layer thin film, a semiconductor layer thin film, a doped semiconductor layer thin film and a source-drain metal thin film (not shown) are continually deposited on the base substrate 10 formed with the gate pattern shown in FIG. 3, so as to obtain a stack of these thin films. Photoresist is coated on the source-drain metal thin film on the top of the stack, exposed with a double-tone mask and developed, and then etched to etch off the semiconductor layer thin film, the doped semiconductor layer thin film and the source-drain metal thin film in an area without photoresist.

Figure 4:
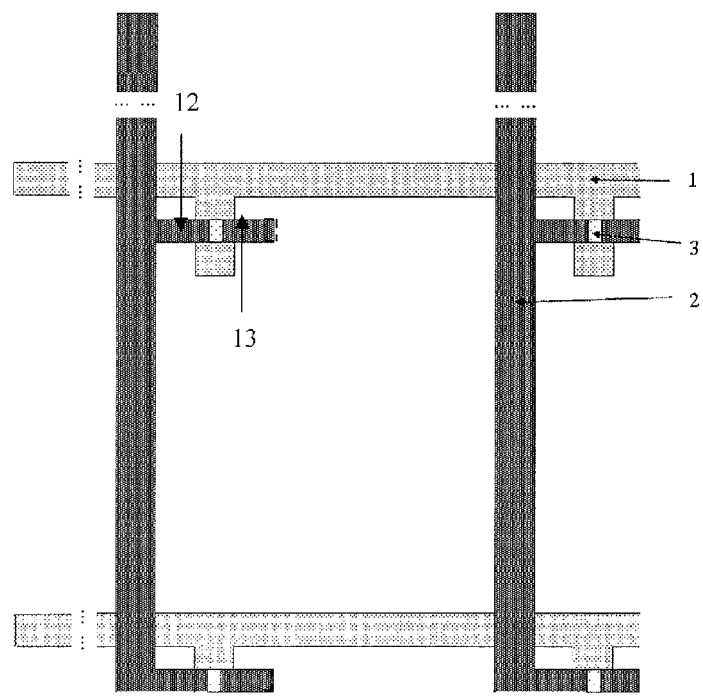
FIG. 4 is a schematic view after a semiconductor channel and a source-drain pattern are formed on the basis of the array substrate shown in FIG. 3 in the course of manufacturing the array substrate according to the first embodiment.

Next, the photoresist is thinned by ashing. Subsequently, the semiconductor layer at a channel location of the thin film transistor is etched off by dry etching. Then, the photoresist is removed so as to form the semiconductor channel and the source-drain pattern. Here, the structure of the array substrate is shown in FIG. 4. As shown in FIG. 4, the data lines 2 and the gate lines 1 vertically intersect; a source electrode 12 and a drain electrode 13 are fainted over an active layer (not shown) and opposite to each other, a portion of the active layer between the source electrode 12 and the drain electrode 13 constitutes a channel region 3 and corresponds to the gate electrode 11; the active layer comprises a stack of the semiconductor layer thin film and the doped semiconductor layer thin film which have been patterned; and the data lines 2 are integrally formed with the source electrodes 12.

Then, a first transparent electrode layer (not shown) is deposited on the base substrate 10 formed with the above structure.

Or in another example, the step 301 may also comprise sequentially performing photolithography processes to form a gate pattern, a semiconductor channel and a source-drain pattern on the base substrate, and then depositing a resin layer and a first transparent electrode layer. That is, before a first transparent electrode layer is deposited, the resin layer with a certain thickness is firstly deposited. The thickness is, for example, 1~3 μm, and preferably, may be set as 2 μm. In the example, by deposition of the resin layer, capacitance between a pixel electrode and a gate line can be decreased, and areas of the pixel electrode and a common electrode can be increased so as to increase the aperture ratio.

Step 302, exposing with a mask and developing the base substrate on which the first transparent electrode layer is deposited and then a photoresist is coated, so that the photoresist is retained at a location where a pixel electrode is to be formed so as to form a photoresist pattern for the pixel electrode.

Figure 5:
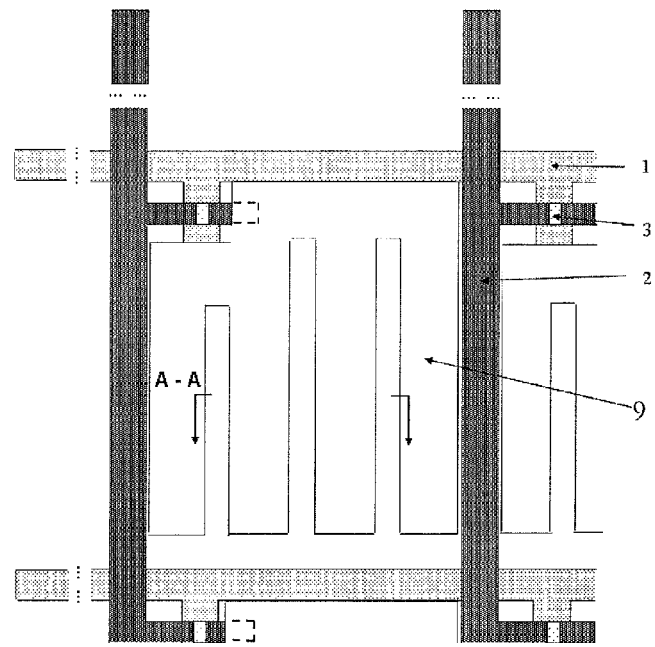
FIG. 5 is a schematic view after a photoresist pattern is formed during a method for manufacturing the array substrate according to the first embodiment.

For example, in the preceding step, the first transparent electrode layer is deposited on the whole base substrate, and a common transparent conductive material is indium tin oxide (ITO) or indium zinc oxide (IZO), the thickness of which is, for example, between 100 Å and 1000 Å; the ITO is, for example, a nanometer ITO material. The photoresist formed on the first transparent conductive layer is formed to be a photoresist pattern through an exposure and development process with a mask; at the location of the transparent pixel electrode in a pixel unit, the photoresist with a certain thickness is retained, as shown in FIG. 5. In FIG. 5, the photoresist 9 covers the location where a pixel electrode 5 is to be formed, and a width of the photoresist 9 is slightly larger than a width of the pixel electrode 5 to be formed.

Step 303, etching the first transparent conductive layer on which the photoresist pattern is formed so as to form a pixel electrode.

Figure 6:
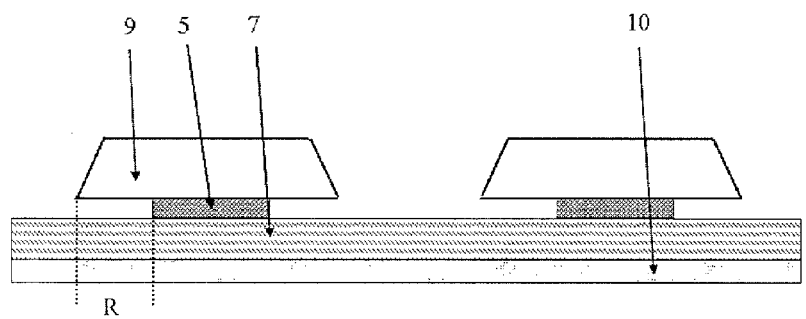
FIG. 6 is a structurally schematic view showing a cross-section taken along line A-A for the array substrate shown in FIG. 5 after it is etched.

For example, a chemical method can be used to etch the first transparent conductive layer on the base substrate, and the used acidic etching solution may be sulphuric acid, nitric acid, acetic acid, and mixed acid with a certain concentration, so as to etch a pattern of a transparent electrode for the pixel electrode. After the etching, a cross-sectional structure taken along line A-A drawn in FIG. 5 is shown in FIG. 6. At this time, the shape of the pixel electrode 5 is formed. The pixel electrode 5 is an example of the first transparent electrode of the present invention. A part of the formed pixel electrode 5 overlaps the drain electrode 13, so as to achieve an electric connection between them.

For example, an over-etching is assured to a certain extent by controlling process parameters, such as etch time, temperature, concentration of etching solution, and so on, and other factors, so that the pixel electrode 5 under the photoresist pattern 9 is indented R with respect to the photoresist pattern 9 thereon (as shown in FIG. 6) and the indentation after the over-etching is, for example, about 2~10 μm. In FIG. 6, the resultant pixel electrode 5 is formed on a gate insulating layer 7. An amount of the over-etching can be properly adjusted according to requirements to obtain a desired interval. The over-etching process can further make sure that a gap is formed between the pixel electrode and a common electrode formed thereafter and a uniform slit width is obtained. Accordingly, a uniform parallel electric field can be formed between the pixel electrode and the common electrode, to thereby overcome the problem that brightness/darkness of a display picture of a liquid crystal display is non-uniform.

Step 304, sequentially depositing a protection layer and a second transparent electrode layer on the base substrate after the etching, and then lifting off the photoresist.

The protection layer and the second transparent electrode layer are deposited on a glass substrate 10 having the cross-section as shown in FIG. 6, i.e., deposition of the protection layer and the second transparent electrode layer is carried out when the photoresist pattern 9 has not been removed. The transparent conductive material for the second transparent electrode layer is the same as or different from that for the first transparent electrode layer, and for example, is ITO material.

Figure 7:
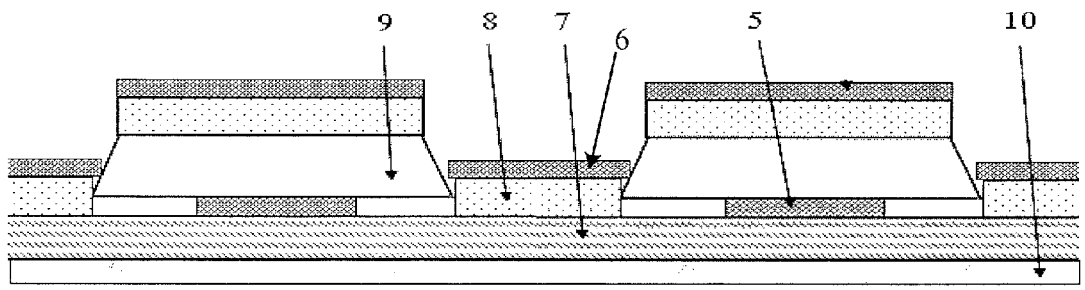
FIG. 7 is a structurally schematic view showing a cross-section taken along line A-A for the array substrate shown in FIG. 5 after it is etched and a protection layer and an ITO layer are deposited.

FIG. 7 is a structurally schematic view showing a cross-section taken along line A-A after the protection layer and the second transparent electrode layer are deposited on the structure shown in FIG. 5. As seen from FIG. 7, the photoresist pattern 9 is located above the pixel electrode 5, and a protection layer 8 and the second transparent electrode layer are located above the photoresist pattern 9 in sequence. The second transparent electrode layer is used to form a common electrode 6; meanwhile, the protection layer 8 and the second transparent electrode layer are also deposited at a gap between two pixel electrodes 5. The protection layer 8 is usually a silicon nitride layer, which is an insulating and corrosion resistant material, thus it can effectively prevent a gate metal layer and a source-drain metal layer from being corroded. In another example, the protection layer 8 may be omitted, and uniformity of electric field is not affected. Because ITO is a corrosion resistant material, the protection layer above it may be omitted. In addition, because the silicon nitride layer is an insulating material, an electric field around it will not be affected. Thus, absence of the protection layer 8 has no effect on deflection of liquid crystals upon driven by a voltage.

Figure 8:
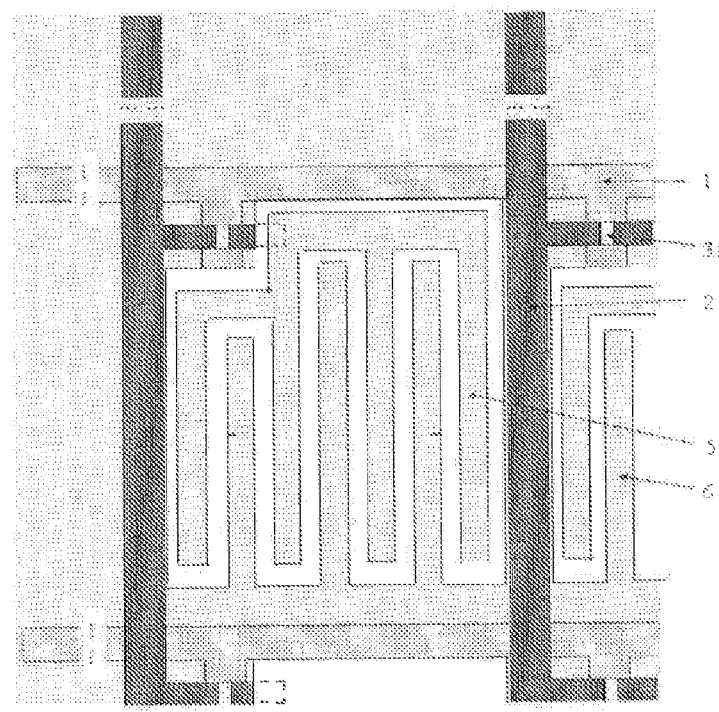
FIG. 8 is a structurally schematic view showing the array substrate shown in FIG. 7 after the photoresist is lift off.

Next, a photoresist lifting-off process is performed on the array substrate having the cross-section as shown in FIG. 7. It should be appreciated that, as the photoresist lifting-off process is performed here, for example, the photoresist 9 together with the protection layer 8 and the second transparent electrode layer deposited on the photoresist is lift off; a structure on the base substrate 10 after the lifting-off is shown in FIG. 8. Here, on the periphery of the base substrate, for example, on the outside of the gate line 1 and the data line 2, the second transparent electrode layer 61 is remained (the shadowed part). The pattern of the common electrode 6 is formed here. The common electrode 6 is an example of a second transparent electrode of the present invention. The pixel electrode 5 and the common electrode 6 each are comb-like electrodes, and their finger parts are interdigitated with each other with slits therebetween.

Step 305, performing exposure and etching again on the base substrate with the photoresist having been lift off so as to remove the remaining second transparent electrode layer in the peripheral area.

Photoresist is coated again on the base substrate 10, and a photoresist pattern is formed on the substrate through an exposure and development process with a mask. In a pixel area, the photoresist is retained to be a certain thick, and in the peripheral area, the photoresist is not retained. Herein, a peripheral area means the region not for effective displaying in the array substrate, and is typically around the display region.

Figure 9:
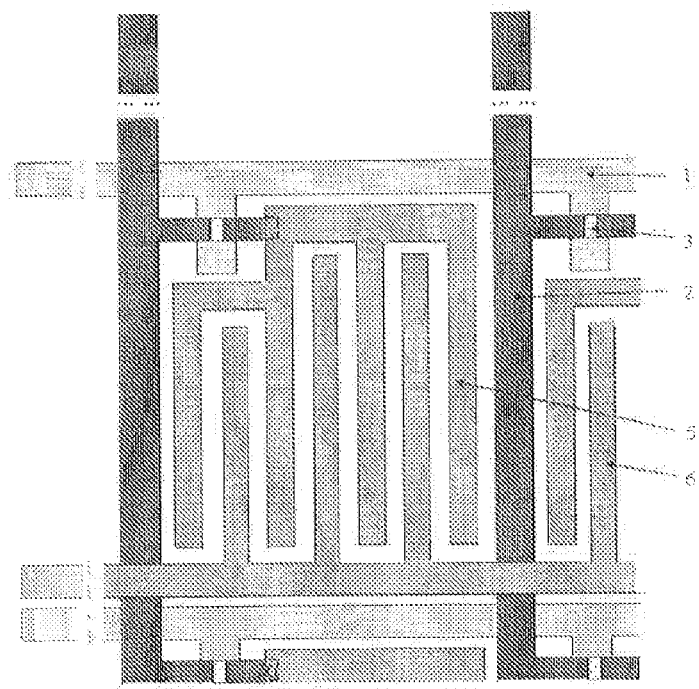
FIG. 9 is a structurally schematic view showing the array substrate shown in FIG. 8 after a transparent electrode layer in a peripheral area is removed.

An etching, such as a wet etching, is performed with the formed photoresist pattern. The structure of the array substrate after etched is shown in FIG. 9.

Step 306, forming a via hole by etching with a via-hole mask.

The via hole, i.e., a through hole, acts to connect the gate metal layer or the source-drain metal layer to a pad area on the periphery. For example, the transparent electrode layer (e.g., an ITO layer) is connected to the gate metal layer or the source-drain metal layer thereunder through the via hole. The way of making connection is a connection between the transparent electrode layer and the gate metal layer, or a connection between the transparent electrode layer and the source-drain metal layer.

Figure 10:
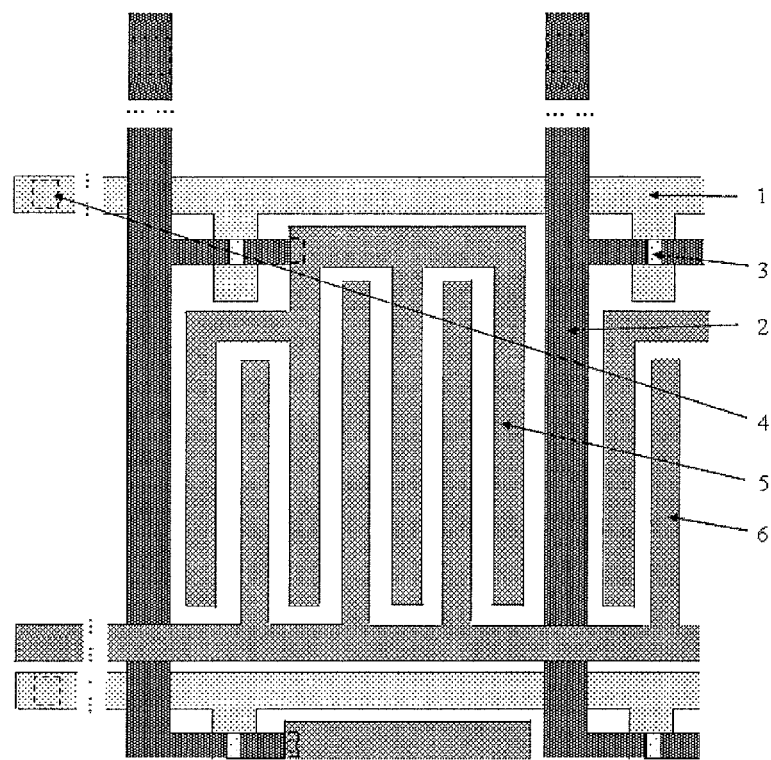
FIG. 10 is a structurally schematic view showing the array substrate finally obtained by the method for manufacturing the array substrate according to the first embodiment.

A layer of photoresist is coated on the structure formed as above, and a photoresist pattern is formed on the base substrate through an exposure and development process with the via-hole mask, in which, the photoresist is retained to a certain thick in a display area. Then, the transparent electrode layer in the peripheral area of the substrate is removed by, for example, wet etching, to accordingly form the via hole, and FIG. 10 shows the structure of the array substrate which is finally obtained by manufacture; via holes 4, for example, are formed on terminals of the gate lines 1 and the data lines 2 in the peripheral area, so that part of the terminals of the gate line and the data line can be connected to other wirings.

In the foregoing method of the embodiment, the forming order of the pixel electrode 5 and the common electrode 6 can be interchanged; accordingly, in another example, the common electrode 6 is formed first and is an example of the first transparent electrode of the invention, and the pixel electrode 5 is formed later and is an example of the second transparent electrode of the invention.

Second Embodiment

A method for manufacturing an array substrate of the present invention according to a second embodiment comprises the following steps.

Step 401, sequentially performing photolithography processes to form of a gate pattern, a semiconductor channel and a source-drain pattern on a base substrate, and then depositing a first transparent electrode layer.

Figure 11:
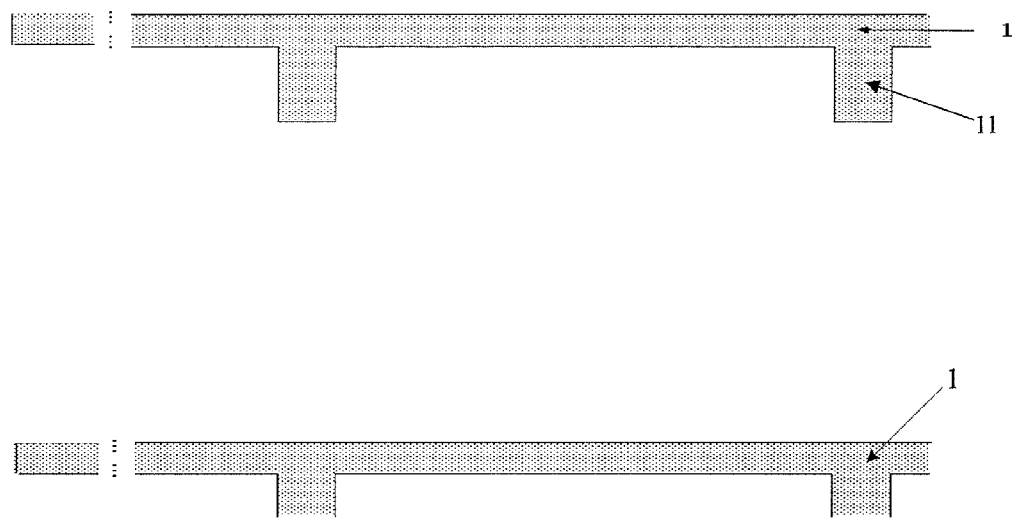
FIG. 11 is a schematic view after a gate pattern is formed in the course of manufacturing an array substrate according to a second embodiment.

FIG. 11 illustrates upper and lower (two rows) gate lines 1 formed on the base substrate 10 with gate electrodes 11 formed on each of the gate lines 1; here, the gate electrode 11 is integrally formed with a corresponding gate line 1.

Figure 12:
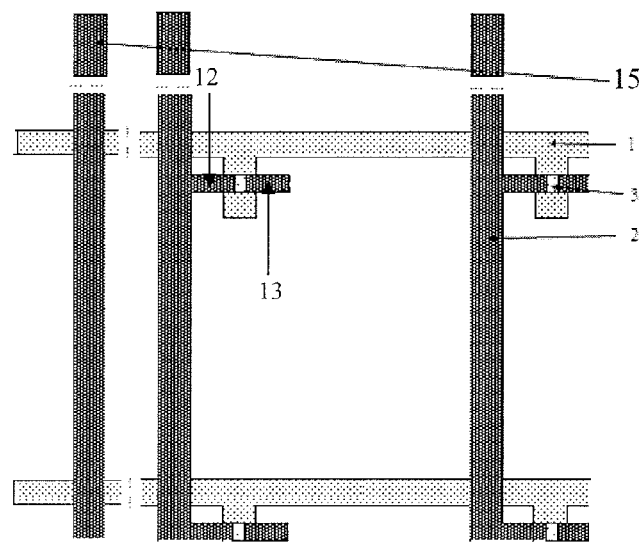
FIG. 12 is a schematic view after a semiconductor channel and a source-drain pattern are formed on the basis of the array substrate shown in FIG. 11 in the course of manufacturing the array substrate according to the second embodiment.

In this step, after the gate pattern is formed on the base substrate, the semiconductor channel and the source-drain pattern are prepared, and a structure of the array substrate obtained accordingly is shown in FIG. 12. In the embodiment, the source-drain pattern comprises patterns for a data line, a common electrode line, and source and drain electrodes of a thin film transistor.

As shown in FIG. 12, data lines 2 and the gate lines 1 vertically intersect; a common electrode line 15 is parallel to the data lines 2, and is, for example, located in a peripheral area of the prepared array substrate outside a display area. Within each pixel unit, a source electrode 12 and a drain electrode 13 of the thin film transistor are formed over an active layer (not shown) and opposite to each other, a portion of the active layer between the source electrode 12 and the drain electrode 13 constitutes a channel region 3 and corresponds to the gate electrode 11; the active layer comprises a stack of a semiconductor layer thin film and a doped semiconductor layer thin film which are patterned; and the data line 2 is integrally formed with the source electrode 12.

Then, a first transparent electrode layer (not shown) is deposited on the base substrate 10 formed with the above structure. Or, in another example, a resin layer may be firstly deposited, and then a first transparent electrode layer may be deposited.

Except for formation of the common electrode layer 15, the process, material, parameter and so on for the step 401 of the second embodiment are the same as those for the step 301 of the first embodiment, so details are omitted here.

Step 402, exposing with a mask and developing the base substrate, on which the first transparent electrode layer is deposited and photoresist is coated later, retaining photoresist at a location where a pixel electrode is to be foiled, so as to form a photoresist pattern.

Figure 13:
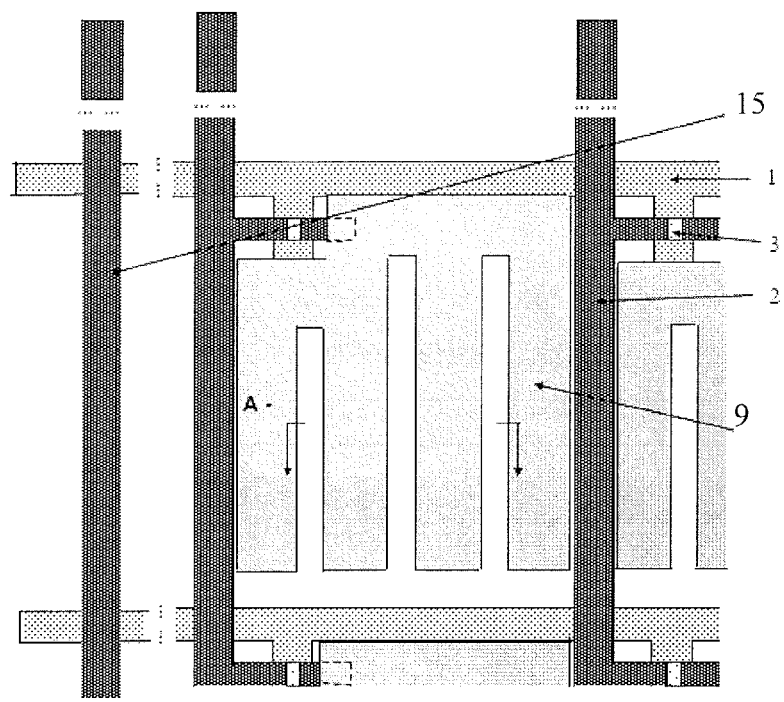
FIG. 13 is a schematic view after a photoresist pattern is formed during a method for manufacturing the array substrate according to the second embodiment.

The processes, materials, parameters and so on for the step 402 of the second embodiment are substantially the same as those for the step 302 of the first embodiment, so details are omitted here. As shown in FIG. 13, photoresist 9 covers a location where a pixel electrode 5 is to be formed, and a width of the photoresist 9 is slightly larger than a width of the pixel electrode 5 to be formed.

Step 403, etching the first transparent conductive layer on which the photoresist pattern is formed so as to form the pixel electrode.

The processes, materials, parameters and so on for the step 403 of the second embodiment are substantially the same as those for the step 303 of the first embodiment, so details are omitted here.

Step 404, sequentially depositing a protection layer and a second transparent electrode layer on the base substrate after the etching, and then lifting off the photoresist.

Figure 14:
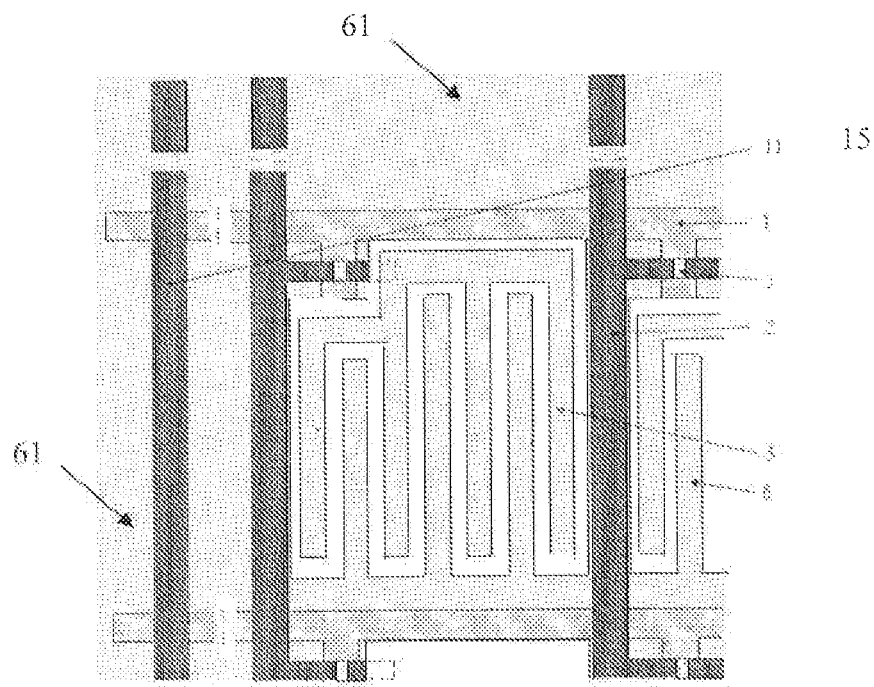
FIG. 14 is a structurally schematic view showing the array substrate shown in FIG. 13 after the photoresist is lift off.

The processes, materials, parameters and so on for the step 404 of the second embodiment are substantially the same as those for the step 304 of the first embodiment, so details are omitted here. FIG. 14 shows a structure on the base substrate 10 after the photoresist 9 and the protection layer and the second transparent electrode layer deposited on the photoresist are lift off together. In a peripheral area, the second transparent electrode layer 61 is remained.

Step 405, performing exposure and etching again on the base substrate after the photoresist is lift off, so as to remove the remaining second transparent electrode layer in the peripheral area.

Figure 15:
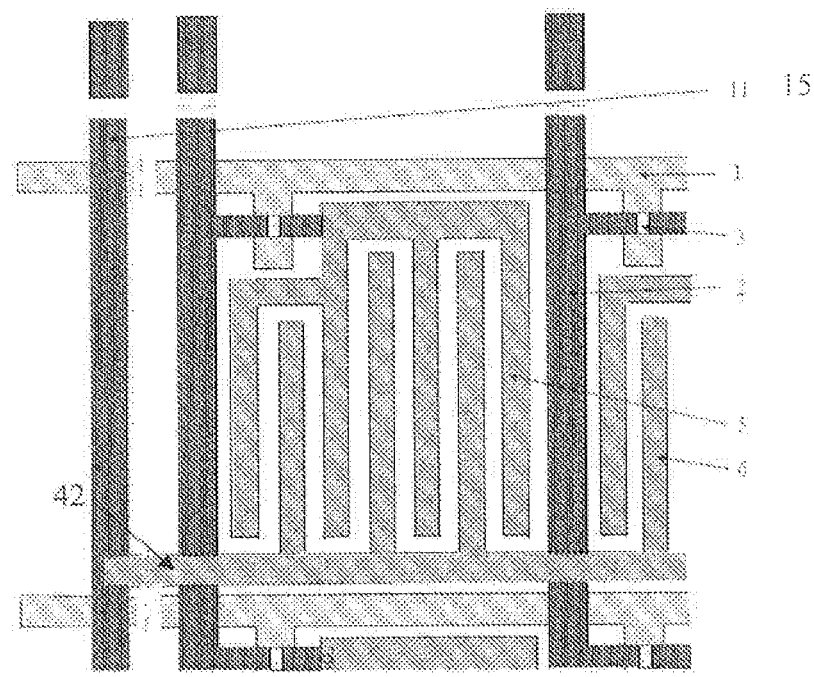
FIG. 15 is a structurally schematic view showing the array substrate shown in FIG. 14 after a transparent electrode layer in a peripheral area is removed.

The processes, materials, parameters and so on for the step 405 of the second embodiment are substantially the same as those for the step 305 of the first embodiment, so details are omitted here. Etching, such as wet etching, is performed with the formed photoresist pattern. The structure of the array substrate after etched is shown in FIG. 15. For pixel units in a row, common electrodes 6 are connected to each other and directly overlap the common electrode line 15 at the location 42 in the peripheral area so as to achieve electric connection. That is, the common electrodes 6 are connected to the common electrode line 15 without a via hole.

Likewise, within each pixel unit, the pixel electrode 5 also directly overlaps the drain electrode 13 of the thin film transistor to achieve electric connection. That is, the pixel electrode 5 is connected to the drain electrode 13 without a via hole.

Step 406, forming a via hole with a via-hole mask.

Figure 16:
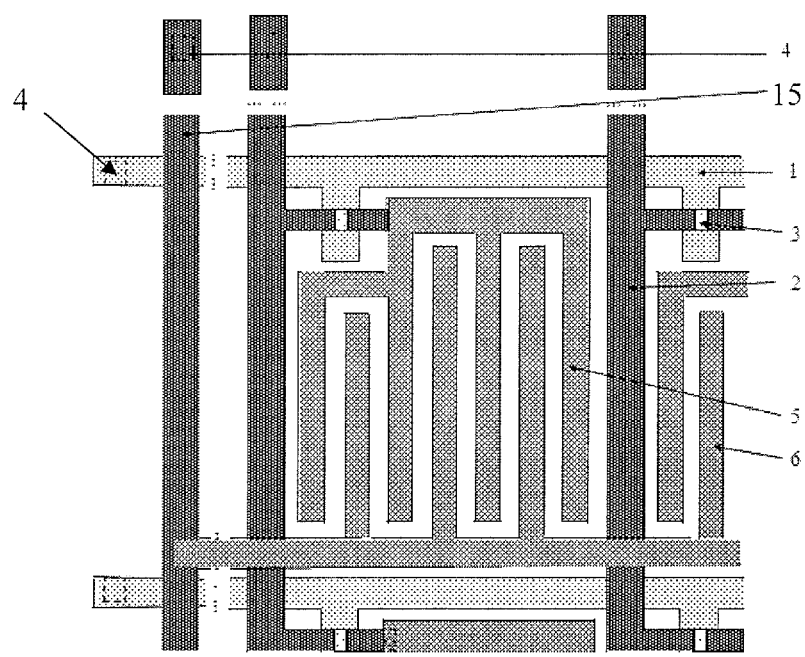
FIG. 16 is a structurally schematic view showing the array substrate finally obtained by the method for manufacturing the array substrate according to the second embodiment.

The processes, materials, parameters and so on for the step 406 of the second embodiment are substantially the same as those for the step 306 of the first embodiment, so details are omitted here. FIG. 16 shows a structure of the array substrate which is finally obtained by manufacture; via holes 4, for example, are formed over terminals of the gate lines 1 and the data lines 2 in the peripheral area, so that part of the terminals of the gate lines and the data lines can be connected to other wirings.

In the foregoing method of the embodiment, the forming order of the pixel electrode 5 and the common electrode 6 can be interchanged; accordingly, in another example, the common electrode 6 is formed first to be an example of the first transparent electrode of the invention, and the pixel electrode 5 is formed later to be an example of the second transparent electrode of the invention.

According to an embodiment of the present invention, there is also provided an array substrate, and this array substrate is one prepared by the foregoing methods and is such as an IPS type array substrate.

According to an embodiment of the present invention, there is further provided a display device, which comprises the above-mentioned array substrate. An example of the display device comprises a liquid crystal display device, electronic paper display device, Organic Light Emitting Display (OLED) device, etc. and it can be applied to cell phones, tablet computers, televisions, display apparatuses, notebook computers, digital photo frames, navigators and any other products or components in need of display function.

For example, an example of the display device is a liquid crystal display device. The liquid crystal display device can further comprise an opposed substrate, which is disposed opposite to the array substrate to form a liquid crystal cell with liquid crystals for display being filled therein, so that a liquid crystal layer is interposed between the array substrate and the opposed substrate. The opposed substrate is, for example, a color filter substrate.

According to the methods of embodiments of the present invention, by Forming patterns for the pixel electrode and common electrode in the display area of the array substrate in the same photolithography process, the Mura problem caused by dislocation of the pixel electrode and the common electrode can be overcome, thereby assuring uniformity of displayed pictures for the array substrate in a wide viewing angle mode, especially uniformity of displayed pictures for a large-scale panel.

The structures in the foregoing embodiments of the present invention are merely exemplary, and the order of the films in the display area can be changed in various manners, as long as elements (such as a gate electrode, source electrode, drain electrode and pixel electrode, etc.) necessary for driving a panel are produced to make sure that the panel is normally driven. For example, a common electrode and a pixel electrode layer are first produced, and a gate electrode, source and drain electrodes and so on are produced later, as long as the pixel electrode can be connected to the drain electrode by a certain method. The connection can be a connection through a via hole or direct overlapping, and the specific connecting manner is omitted here.

The foregoing is merely the preferred embodiments of the present invention, and is not used to limit the protection scope of the present invention. The scope of the present invention is defined by the following claims.

The invention claimed is:

1. A method for manufacturing an array substrate, comprising:
    depositing a first transparent electrode layer on a base substrate, coating a first photoresist on the first transparent electrode layer, and performing exposure and development on the first photoresist to retain the first photoresist at a location where a first transparent electrode is to be formed, so that a first photoresist pattern is formed;
    etching the first transparent electrode layer with the first photoresist pattern so as to form the first transparent electrode;
    depositing a second transparent electrode layer on the base substrate after the etching, and then performing a photoresist lifting-off process on the first photoresist pattern to remove a part of the second transparent electrode layer on the first photoresist pattern so that a second transparent electrode is formed; and
    after the second transparent electrode is formed, coating again a second photoresist on the base substrate, performing exposure and development on the second photoresist to form a second photoresist pattern, and then etching with the second photoresist pattern so as to remove the second transparent electrode layer in a peripheral area outside a pixel area.

2. The method according to claim 1, after removing the second transparent electrode layer in the peripheral area, the method further comprising:
    forming a via hole in the peripheral area by etching.

3. The method according to claim 1, wherein, before depositing the first transparent electrode layer, the method further comprises:
    forming a gate pattern, a semiconductor channel and a source-drain pattern on the base substrate in sequence.

4. The method according to claim 3, wherein one of the first transparent electrode and the second transparent electrode is a pixel electrode, and another is a common electrode, and the pixel electrode and a drain electrode of a thin film transistor overlap each other.

5. The method according to claim 4, wherein the common electrode and a common electrode line are electrically connected.

6. The method according to claim 5, wherein the common electrode and the common electrode line directly overlap.

7. The method according to claim 4, wherein the pixel electrode and the drain electrode of the thin film transistor directly overlap.

8. The method according to claim 3, wherein the source-drain pattern comprises patterns of a data line, a common electrode line, and source and drain electrodes of a thin film transistor.

9. The method according to claim 1, wherein etching the first transparent electrode layer with the first photoresist pattern comprises:
    forming an indention of the first transparent electrode under the first photoresist pattern through over-etching, so that a width of the obtained first transparent electrode is smaller than a width of the first photoresist pattern.

10. The method according to claim 9, wherein an amount of the indentation is 2~10 µm.

11. The method according to claim 1, before depositing the second transparent electrode layer on the base substrate, the method further comprising:
    depositing a protection layer on the base substrate after the etching to form the first transparent electrode.

12. The method according to claim 1, wherein, before depositing the first transparent electrode layer, the method further comprises:
    sequentially performing photolithography processes to form a gate pattern, a semiconductor channel and a source-drain patter on the base substrate, then forming a resin layer and depositing the first transparent electrode layer on the resin layer.

13. The method according to claim 1, wherein a way of performing the photoresist lifting-off process is:
    lifting off the first photoresist pattern together with the second transparent electrode layer deposited on the first photoresist.

14. An array substrate which is the array substrate prepared by the method according to claim 1.

15. A display device comprising an array substrate, which is the array substrate according to claim 14.

16. The display device according to claim 15, further comprising: an opposed substrate and a liquid crystal layer interposed between the array substrate and the opposed substrate.

* * * * *